(12) United States Patent
Chen et al.

(10) Patent No.: US 7,084,564 B2
(45) Date of Patent: Aug. 1, 2006

(54) ORGANIC LIGHT EMITTING DEVICE WITH INCREASED SERVICE LIFE

(75) Inventors: Wen-Kuen Chen, Hsinchu (TW); Chao-Chin Sung, Pingtung (TW); Chung-Wen Ko, Taipei (TW); Yi-Fan Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 62 days.

(21) Appl. No.: 10/707,299

(22) Filed: Dec. 4, 2003

(65) Prior Publication Data
US 2004/0222739 A1 Nov. 11, 2004

(30) Foreign Application Priority Data
May 6, 2003 (TW) .............................. 92112286 A

(51) Int. Cl.
*H01J 1/62* (2006.01)
*H01J 1/63* (2006.01)
*H01J 1/68* (2006.01)
*H01J 63/04* (2006.01)
*B32B 9/00* (2006.01)

(52) U.S. Cl. ...................... 313/504; 313/503; 313/506; 428/690

(58) Field of Classification Search ................ 313/503, 313/504, 506; 428/690
See application file for complete search history.

(56) References Cited

U.S. PATENT DOCUMENTS 6,130,001 A * 10/2000 Shi et al. .................... 428/690
6,798,134 B1 * 9/2004 Wang .......................... 313/504

* cited by examiner

*Primary Examiner*—Mariceli Santiago
*Assistant Examiner*—Elizabeth Rielley
(74) *Attorney, Agent, or Firm*—Jianq Chyun IP Office

(57) ABSTRACT

An OLED including an anode layer, a first mixing layer over the anode layer, a mixing layer on the first mixing layer, a second mixing layer on the mixing layer, and a cathode layer over the second mixing layer is provided. The mixing layer is a mixture of an organic light emitting material, a hole and an electron transport material, and a volume ratio of the hole transport material to the electron transport material thereof is X %. The first and second mixing layers are both mixtures of the hole and electron transport materials. A volume ratio of the hole transport material to electron transport material in the first mixing layer decreases gradually from 99% to X % starting from the surface adhered to the anode layer, and that of the second mixing layer increases gradually from X % to 99% starting from the surface adhered to the mixing layer.

15 Claims, 2 Drawing Sheets

US 7,084,564 B2

ORGANIC LIGHT EMITTING DEVICE WITH INCREASED SERVICE LIFE

CROSS REFERENCE TO RELATED APPLICATIONS

This application claims the priority benefit of Taiwan application serial no. 92112286, filed May 6, 2003.

BACKGROUND OF INVENTION

1. Field of the Invention

The present invention relates to an organic light emitting device. More particularly, the present invention relates to an organic light emitting device that can increase the lifetime of the device using thereof.

2. Description of the Related Art

Organic light emitting device ("OLED") is a device that can transfer electric energy to photo energy with high transformation efficiency. The conventional usage of an OLED includes in light guiding devices, display panels, light emitting devices of optical pick-up head and so on. Since the OLED offers a lot of advantages, such as wide viewing angle, fast response speed, wide operation temperature range, less power consumption, full color display, low cost and simple manufacturing process, the OLED has become a major trend in the development of a macromedia display device in recent years.

FIG. 1 is a cross-sectional view illustrating the basic construction of a conventional OLED which includes a substrate 100, an anode layer 102, a hole transport layer 106, an organic light emitting layer 108, an electron transport layer 110, and a cathode layer 114. As shown in FIG. 1, the anode layer 102 is an indium tin oxide ("ITO") electrode layer, and the cathode layer 114 is a metal electrode layer. When a forward bias is applied to both ends of the electrode layers, the electrons and holes are injected from the metal electrode layer 114 and the ITO electrode layer 102 into the organic light emitting layer 108 respectively. The negative charge carriers (electrons) and the positive charge carriers (holes) will combine in the organic light emitting layer 108 through a radiative combination process, and emit photons. However, the hole mobility is about 2 to 3 orders larger than the electron mobility in conventional OLED. Consequently, in order to balance the mobility of holes and electrons, a hole injection layer 104 is disposed in between the ITO electrode layer 102 and the hole transport layer 106, and an electron injection layer 112 is disposed in between the metal electrode layer 114 and the electron transport layer 110. The formation of the injection layers thus help attain a balanced number of hole carriers and electron carriers.

Nevertheless, even though the number of carriers are balanced, charge will accumulate in the hetero-junction interfaces of the hole transport layer 106 and the electron transport layer 110. As a consequence the physical and electronic properties of the OLED will be degraded, and the lifetime of the device using the OLED will also be decreased.

SUMMARY OF INVENTION

Accordingly, one object of the present invention is to provide an OLED which can solve the hetero-junction interface issue, and increase the lifetime of a device using the OLED.

To achieve these and other advantages and in accordance with the purpose of the invention, as embodied and broadly described herein, an OLED including an anode layer, a first mixing layer, a mixing layer, a second mixing layer, and a cathode layer is provided. In the embodiment, the anode layer is formed over a substrate, the first mixing layer is formed on the anode layer, the mixing layer is formed on the first mixing layer, the second mixing layer is formed on the mixing layer, and the cathode layer formed over the second mixing layer. The first mixing layer includes, but not limited to, a mixture of a hole transport material and an electron transport material. The mixing layer includes, but not limited to, a mixture of an organic light emitting material, the hole transport material and the electron transport material. The second mixing layer includes, but not limited to, a mixture of the hole transport material and the electron transport material.

In a preferred embodiment of the invention, when the volume ratio of the hole transport material to the electron transport material in the mixing layer is X %, there is a gradual decrease in the volume ratio of hole transport material to the electron transport material in the first mixing layer from 99% to X % starting from the surface adhered to the anode layer. Whereas, the volume ratio of hole transport material to the electron transport material in the second mixing layer increases gradually from X % to 99% starting from the surface adhered to the mixing layer.

In a preferred embodiment of the invention, when the volume ratio of the hole transport material to the electron transport material in the mixing layer is 50%, the molar ratio of hole transport material to the electron transport material in the first mixing layer decreases gradually from 99% to 50% starting from the surface adhered to the anode layer. Whereas the volume ratio of hole transport material to the electron transport material in the second mixing layer increases gradually from 50% to 99% starting from the surface adhered to the mixing layer.

To achieve these and other advantages and in accordance with the purpose of the invention, another OLED including an anode layer, a hole transport layer, a mixing layer, an electron transport layer and a cathode layer is provided. The anode layer is formed over a substrate, and the hole transport layer is formed over the anode layer. Moreover, the mixing layer is formed over the hole transport layer, in which the mixing layer is a mixture of an organic light emitting material, a hole transport material and an electron transport material. In addition, the volume ratio of the hole transport material to the electron transport material in the mixing layer decreases gradually from 99% to 1% starting from the surface adhered to the hole transport layer. Following, the electron transport layer is formed over the mixing layer and a cathode layer is formed over the electron transport layer. Therefore, another OLED is provided in the disclosed invention.

Accordingly, in the invention, the first mixing layer and the second mixing layer are provided to replace the hole transport layer and the electron transport layer, whereas the mixing layer (using a mixture of an organic light emitting material, a hole transport material and an electron transport material) is provided to replace the single organic light emitting layer 108 in FIG. 1 found in conventional OLED. In this manner, the issue of charge accumulation in the hetero-junction interface, which is the junction between the hole and the electron transport layer, can be solved and the lifetime of the device using thereof can be increased.

Moreover, as another aspect of the invention, the volume ratio of hole transport material to the electron transport material in the mixing layer is gradually changing. Thus, the disclosed OLED of the invention can increase the lifetime of a device using thereof.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
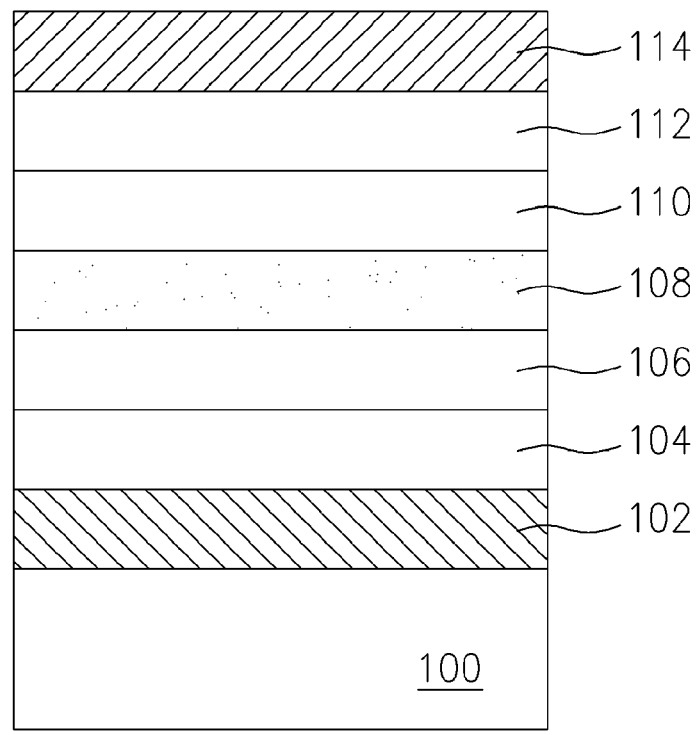
FIG. 1 is a cross-sectional view illustrating the basic construction of a conventional OLED.
Figure 2:
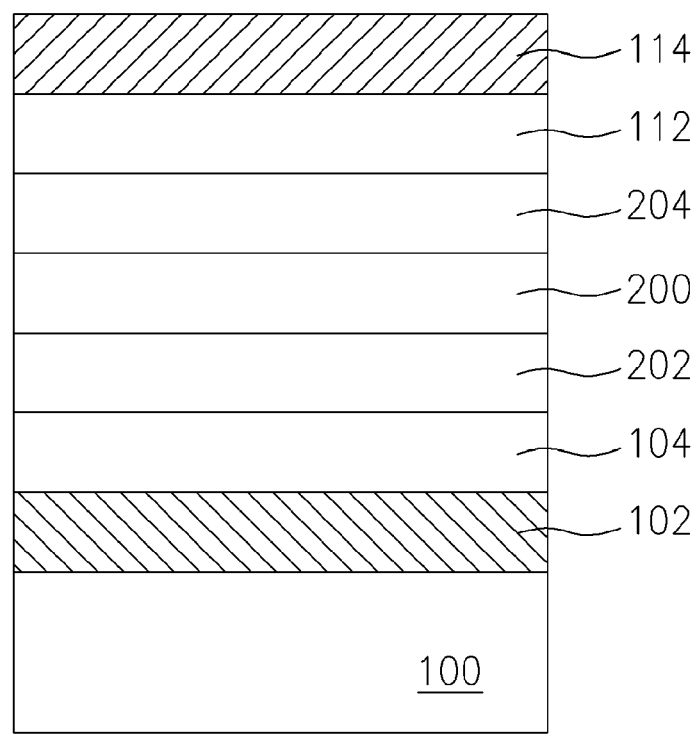
FIG. 2 is a cross-sectional view illustrating an OLED of a preferred embodiment of the present invention.

FIG. 2 is a cross-sectional view illustrating an OLED of a preferred embodiment of the present invention. Referring to FIG. 2, the present invention provides an OLED including a substrate 100, an anode layer 102, a first mixing layer 202, a mixing layer 200, a second mixing layer 204, and a cathode layer 114.

In the embodiment described above, the substrate 100 is, for example but not limited to, a glass substrate or a plastic substrate. The anode layer 102 is formed over the substrate 100. In a preferred embodiment of the invention, the material of the anode layer 102 includes a transparent conductivity material such as indium tin oxide ("ITO"), or a non-transparent conductivity material.

In FIG. 2, the first mixing layer 202 is formed over the anode layer 102, the mixing layer 200 is formed on the first mixing layer 202, the second mixing layer 204 is formed on the mixing layer 200, and the cathode layer 114 is formed over the second mixing layer 204.

In a preferred embodiment of the invention, a material of the first mixing layer 202 is a mixture of a hole transport material and an electron transport material. A material of the mixing layer 200 is a mixture of an organic light emitting material, a hole transport material and an electron transport material. A material of the second mixing layer 204 is also a mixture of a hole transport material and an electron transport material.

Particularly, in the preferred embodiment of the invention, when the volume ratio of the hole transport material to the electron transport material in the mixing layer 200 is X %, the volume ratio of the hole transport material to the electron transport material in the first mixing layer 202 decreases gradually from 99% to X % starting from the surface adhered to the anode layer 102. In other words, in the first mixing layer 202, while getting near to the anode layer 102, the percentage of the hole transport material increases, and while getting far away from the anode layer 102, the percentage of the hole transport material will decrease. Moreover, the volume ratio of hole transport material to the electron transport material in the second mixing layer 204 increases gradually from X % to 99% starting from the surface adhered to the mixing layer 200. In other words, in the second mixing layer 204, while getting near to the mixing layer 200, the percentage of the electron transport material will decrease, and vice versa.

In a preferred embodiment of the invention, the volume ratio of the hole transport material to the electron transport material in the mixing layer 200 is 50%. Then, the volume ratio of the hole transport material to the electron transport material in the first mixing layer 202 decreases gradually from 99% to 50% starting from the surface adhered to the anode layer 102. And the volume ratio of the hole transport material to the electron transport material in the second mixing layer 204 increases gradually from 50% to 99% starting from the surface adhered to the mixing layer 200.

In a preferred embodiment of the invention, the material of the cathode layer 114 formed over the second mixing layer 204 includes a non-transparent conductivity material, or a transparent conductivity material.

In a preferred embodiment of the invention, it is preferably to further include the formation a hole injection layer 104 between the anode layer 102 and the first mixing layer 202, and the formation an electron injection layer 112 between the cathode layer 114 and the second mixing layer 204. When the hole injection layer 104 and the electron injection layer 112 are formed in the device, the electronic property and the efficiency of the device can be increased.

In the embodiments of the invention described above, a layer is formed by mixing the hole transport material and the electron transport material with a volume ratio gradually changing accordingly along the layer thickness, which is used to replace a layer of the conventional technology formed by using a single hole transport material or a single electron material. Moreover, the material of the mixing layer of the invention is also a mixture of an organic light emitting material, a hole transport material and an electron transport material, which mixing layer is used to replace the single organic light emitting material of the conventional technology. Thus, the first mixing layer, the second mixing layer and the mixing layer can solve the hetero-junction interface issue and avoid the accumulation of the carriers on the junction interface between hetero-junction interfaces. Therefore, the OLED of the invention can increase the lifetime of a device using thereof.

Figure 3:
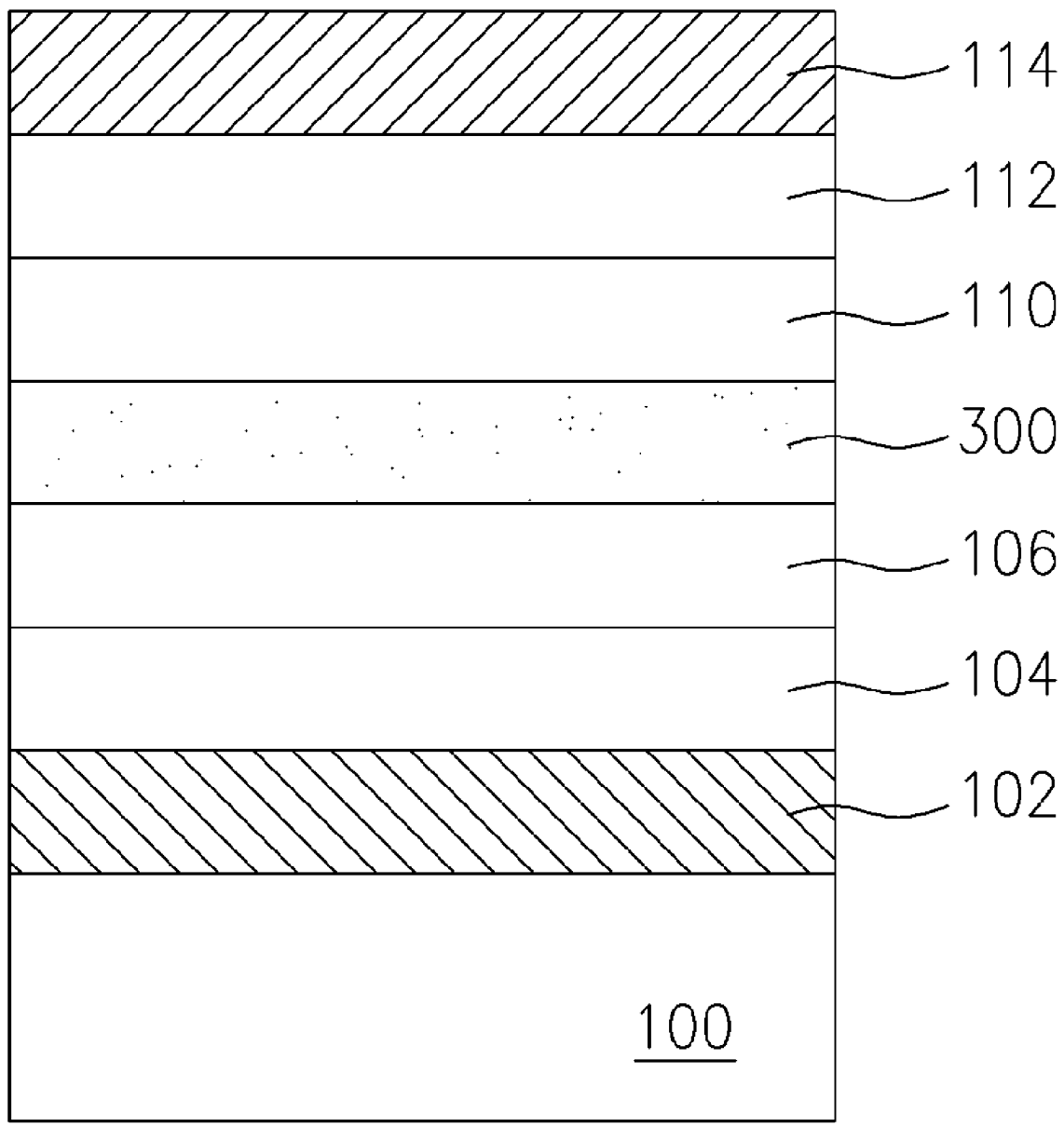
FIG. 3 is a cross-sectional view illustrating an OLED of another preferred embodiment of the present invention.

FIG. 3 is a cross-sectional view illustrating an OLED of another preferred embodiment of the present invention. Referring to FIG. 3, the present invention provides an OLED including a substrate 100, an anode layer 102, a hole transport layer 106, a mixing layer 300, a electron transport layer 110, and a cathode layer 114.

In the embodiment described above, the substrate 100 is, for example but not limited to, a glass substrate or a plastic substrate. The anode layer 102 is formed on the substrate 100. In a preferred embodiment of the invention, the material of the anode layer 102 includes a non-transparent conductivity material or a transparent conductivity material.

In FIG. 3, the hole transport layer 106 is formed over the anode layer 102. The mixing layer 300 is formed on the hole transport layer 106, where a material of the mixing layer 300 is a mixture of an organic light emitting material, a hole transport material and an electron transport material. The volume ratio of the hole transport material to the electron transport materials in the mixing layer 300 decreases gradually from 99% to 1% starting from the surface adhered to the hole transport layer 106. Thus, in the mixing layer 300, the percentage of the hole transport material is much higher than that of the electron transport material in the surface adhered to the hole transport layer 106. And the percentage of the electron transport material is much higher than that of the hole transport material in the region far away from the hole transport layer 106.

Moreover, the electron transport layer 110 is formed on the mixing layer 300, and the cathode layer 114 is formed over the electron transport layer 110, and a material of the cathode layer 114 includes a non-transparent conductivity material or a transparent conductivity material.

In a preferred embodiment of the invention, it is preferably to further include forming a hole injection layer 104 between the anode layer 102 and the hole transport layer 106, and forming an electron injection layer 112 between the cathode layer 114 and the electron transport layer 110. When the hole injection layer 104 and the electron injection layer 112 are formed in the device, the electronic property and the efficiency of the device can be increased.

Moreover, since the material of the mixing layer 300 of the invention is a mixture of an organic light emitting material, a hole transport material and an electron transport material, and the volume ratio of the hole transport material to the electron transport material inside is gradually changing. Thus, the OLED of the invention can increase the lifetime of a device using thereof.

Accordingly, in the invention, the first mixing layer and the second mixing layer are provided to replace the hole transport layer and the electron transport layer; and the mixing layer using a mixture of an organic light emitting material, a hole transport material and an electron transport material is provided to replace the single organic light emitting material of the conventional organic light emitting layer. Thus, the issue of charge accumulation at the heterojunction interface which is the junction between the hole and the electron transport layers can be solved, and the lifetime of a device using the OLED presented in the invention can be increased.

Moreover, the mixing layer of the invention using a mixture of an organic light emitting material, a hole transport material and an electron transport material is provided to replace the conventional organic light emitting layer, and the volume ratio of the hole transport material to the electron transport materials inside is gradually changing. Thus, the OLED of the invention can increase the lifetime of the device using thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An organic light emitting device, comprising:
   an anode layer formed on a substrate;
   a first mixing layer formed over the anode layer, wherein a material of the first mixing layer is a mixture of a hole transport material and an electron transport material;
   a mixing layer formed on the first mixing layer; wherein a material of the mixing layer is a mixture of an organic light emitting material, the hole transport material and the electron transport material;
   a second mixing layer formed on the mixing layer, wherein a material of the second mixing layer is a mixture of the hole transport material and the electron transport material; and
   a cathode layer formed over the second mixing layer;
   wherein, when a volume ratio of the hole transport material to the electron transport materials in the mixing layer is X %, a volume ratio of the hole transport material to the electron transport materials in the first mixing layer decreases gradually from 99% to X % starting from a surface adhered to the anode layer, wherein a volume ratio of the hole transport material to the electron transport material in the second mixing layer increases gradually from X % to 99% starting from a surface adhered to the mixing layer.

2. The organic light emitting device of claim 1, wherein flutter comprises a hole injection layer between the first mixing layer and the anode layer.

3. The organic light emitting device of claim 1, wherein further comprises an electron injection layer between the second mixing layer and the cathode layer.

4. The organic light emitting device of claim 1, wherein the volume ratio of the hale transport material to the election transport material in the mixing layer is 50%, whereby then the volume ratio of the hole transport material to the electron transport material in the first mixing layer decreases gradually from 99% to 50% starting from the surface adhered to the anode layer, and the volume ratio of the hole transport material to the electron transport material in the second mixing layer increases gradually from 50% to 99% starting from the surface adhered to the mixing layer.

5. The organic light emitting device of claim 1, wherein a material of the anode layer comprises a transparent conductivity material or a non-transparent conductivity material.

6. The organic light emitting device of claim 1, wherein a material of the cathode layer comprises a transparent conductivity material or a non-transparent conductivity material.

7. An organic light emitting device, comprising:
   an anode layer formed on a substrate;
   a hole transport layer formed over the anode layer;
   a mixing layer formed on the hole transport layer; wherein a material of the mixing layer is a mixture of an organic light emitting material, a hole transport material and an electron transport material, wherein a volume ratio of the hole transport material to the electron transport material in the mixing layer decreases gradually from 99% to 1% from the surface adhered to the hole transport layer;
   a second mixing layer comprising a mixture of an electron transport material and a hole transport material formed on the mixing layer; and
   a cathode layer formed over the electron transport layer.

8. The organic light emitting device of claim 7, wherein further comprises a hole injection layer between the hole transport layer and the anode layer.

9. The organic light emitting device of claim 7, wherein further comprises an electron injection layer between the second mixing layer and the cathode layer.

10. The organic light emitting device of claim 7, wherein a material of the anode layer comprises a transparent conductivity material or a non-transparent conductivity material.

11. The organic light emitting device of claim 7, wherein a material of the cathode layer comprises a transparent conductivity material or a non-transparent conductivity material.

12. An organic light emitting device, comprising:
an anode layer formed on a substrate;
a hole transport layer formed over the anode layer;
a mixing layer formed on the hole transport layer; wherein a material of the mixing layer is a mixture of an organic light emitting material, a hole transport material and an electron transport material, wherein a volume ratio of the hole transport material to the electron transport material in the mixing layer decreases gradually from 99% to 1% from the surface adhered to the hole transport layer;
a second mixing layer comprising a mixture of an electron transport material and a hole transport material formed on the mixing layer;
an electron injection layer between the second mixing layer and a cathode layer, wherein the cathode layer formed over the electron transport layer.

13. The organic light emitting device of claim 12, wherein further comprises a hole injection layer between the hole transport layer and the anode layer.

14. The organic light emitting device of claim 12, wherein a material of the anode layer comprises a transparent conductivity material or a non-transparent conductivity material.

15. The organic light emitting device of claim 12, wherein a material of the cathode layer comprises a transparent conductivity material or a non-transparent conductivity material.

* * * * *